US011145618B2

(12) United States Patent
Iguchi et al.

(10) Patent No.: US 11,145,618 B2
(45) Date of Patent: Oct. 12, 2021

(54) BONDING EQUIPMENT

(71) Applicant: SHARP KABUSHIKI KAISHA, Sakai (JP)

(72) Inventors: Katsuji Iguchi, Sakai (JP); Masumi Maegawa, Sakai (JP); Keiichi Sawai, Sakai (JP); Hiroyoshi Higashisaka, Sakai (JP); Takanobu Matsuo, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 224 days.

(21) Appl. No.: 16/294,167

(22) Filed: Mar. 6, 2019

(65) Prior Publication Data

US 2019/0279956 A1    Sep. 12, 2019

(30) Foreign Application Priority Data

Mar. 6, 2018  (JP) .............................. JP2018-040056

(51) Int. Cl.
| | |
|---|---|
| *H01L 21/67* | (2006.01) |
| *H01L 21/687* | (2006.01) |
| *H01L 21/677* | (2006.01) |
| *H01L 21/683* | (2006.01) |
| *H01L 23/00* | (2006.01) |

(52) U.S. Cl.
CPC ........ *H01L 24/74* (2013.01); *H01L 21/67051* (2013.01); *H01L 21/67144* (2013.01); *H01L 21/67718* (2013.01); *H01L 21/67721* (2013.01); *H01L 21/687* (2013.01); *H01L 21/6831* (2013.01)

(58) Field of Classification Search
CPC ............... H01L 24/74; H01L 21/67144; H01L 21/67051; H01L 21/687; H01L 21/67718; H01L 21/6831
See application file for complete search history.

(56) References Cited

U.S. PATENT DOCUMENTS

| | | | |
|---|---|---|---|
| 9,142,532 B2 | 9/2015 | Suga et al. | |
| 2006/0054283 A1 | 3/2006 | Yamauchi | |
| 2010/0052189 A1 | 3/2010 | Sakurai et al. | |
| 2010/0111648 A1 | 5/2010 | Tamura et al. | |
| 2014/0158303 A1* | 6/2014 | Hirakawa | ......... H01L 21/67103 156/379 |
| 2019/0027388 A1 | 1/2019 | Seyama | |

FOREIGN PATENT DOCUMENTS

| | | | | |
|---|---|---|---|---|
| JP | 2002-252251 A | 9/2002 | | |
| JP | 2006-086418 A | 3/2006 | | |
| JP | 2006-310442 A | 11/2006 | | |
| JP | 2008-211196 A | 9/2008 | | |
| JP | 2010114466 A | * 5/2010 | ............. | H01L 27/14 |

(Continued)

*Primary Examiner* — Peter Dungba Vo
*Assistant Examiner* — Jose K Abraham
(74) *Attorney, Agent, or Firm* — ScienBiziP, P.C.

(57) ABSTRACT

Bonding equipment includes a laminar flow source, a chip handling portion, a cleaning portion for cleaning a chip, a bonding portion for bonding the chip and a substrate, and a transfer mechanism for transferring the chip from the chip handling portion to the bonding portion. Among these, at least the bonding portion and the cleaning portion are disposed in a laminar flow by the laminar flow source.

20 Claims, 12 Drawing Sheets

(56) References Cited

FOREIGN PATENT DOCUMENTS

| | | |
|---|---|---|
| TW | 353137 B | 2/1999 |
| TW | 201316442 A1 | 4/2013 |
| TW | 201735203 A | 10/2017 |
| WO | 2004/030078 A1 | 4/2004 |
| WO | 2008/065926 A1 | 6/2008 |
| WO | 2013/161891 A1 | 10/2013 |
| WO | WO-2015023232 A1 * | 2/2015 ............. H01L 24/75 |
| WO | WO-2017217252 A1 * | 12/2017 ............... B08B 5/02 |

* cited by examiner

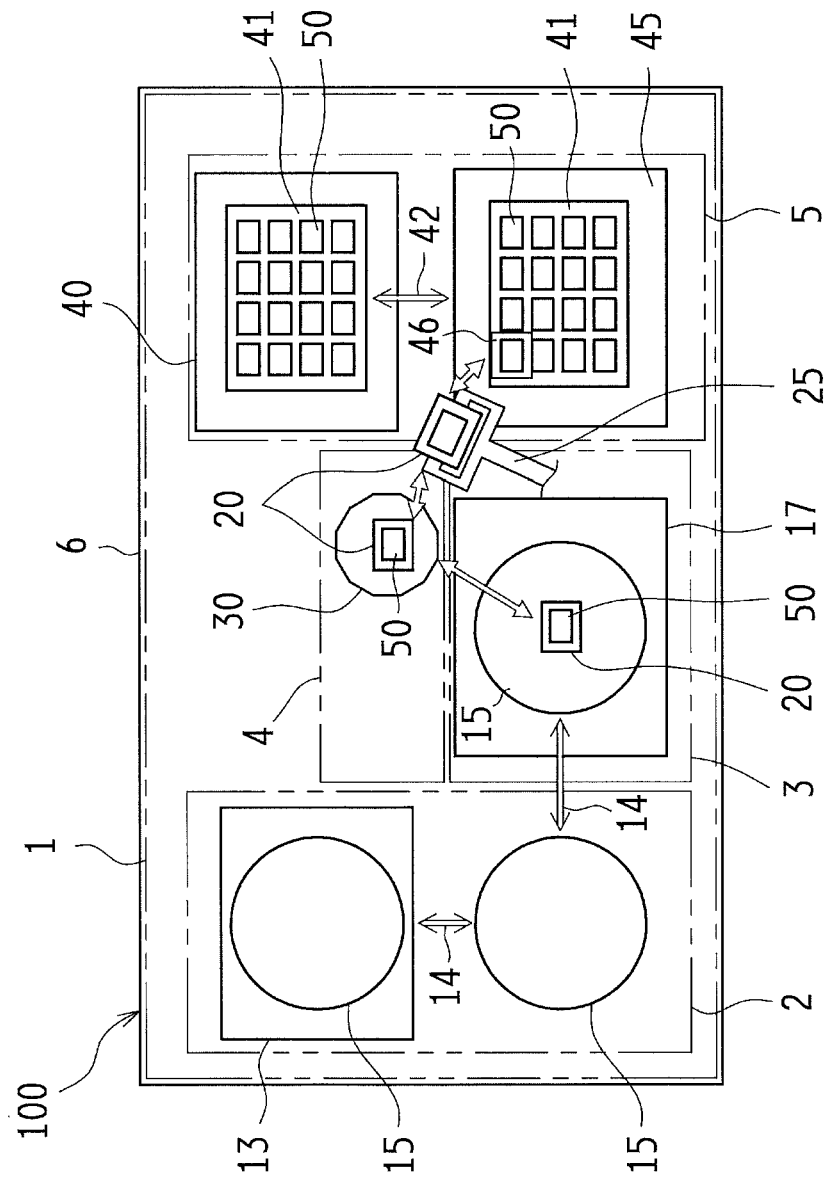

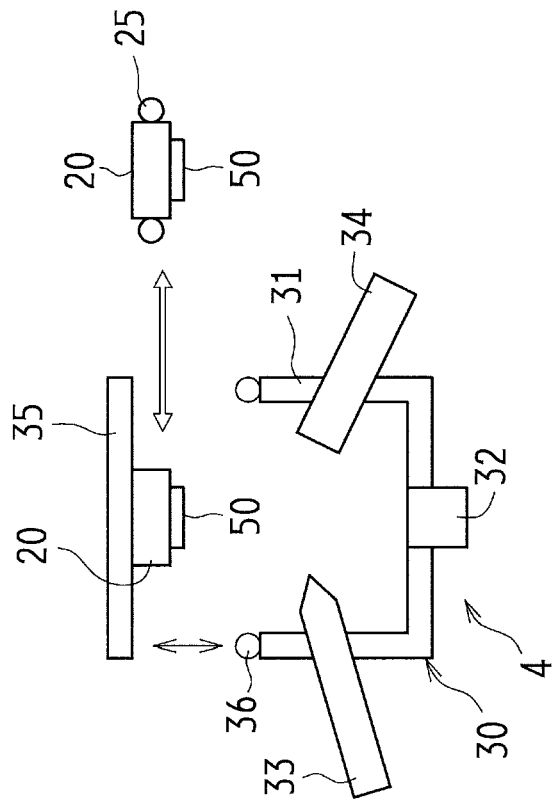
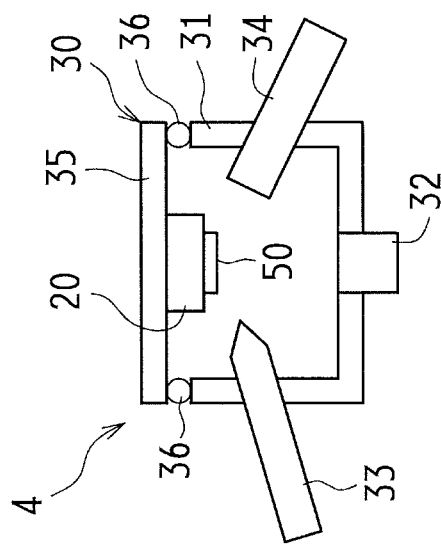

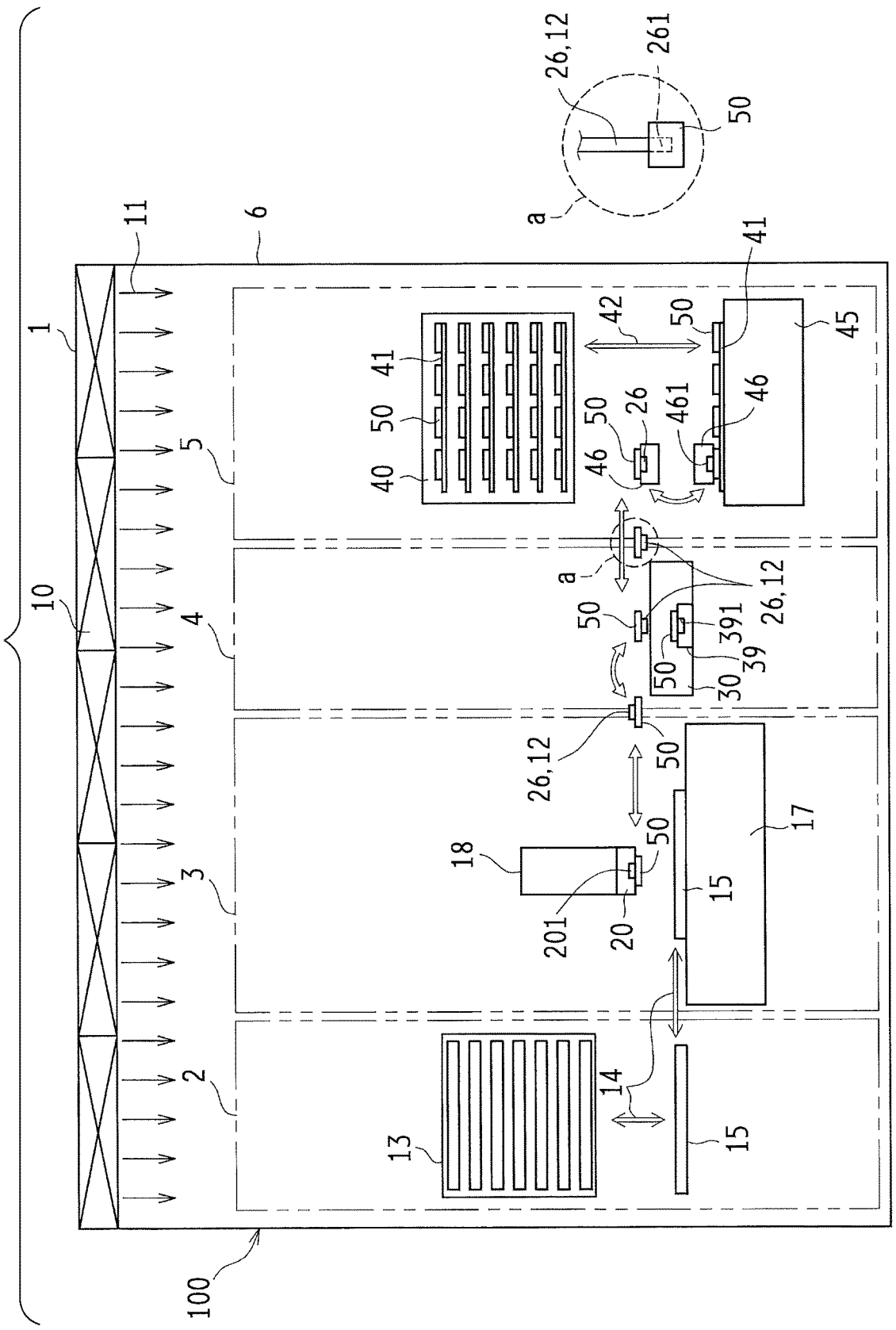

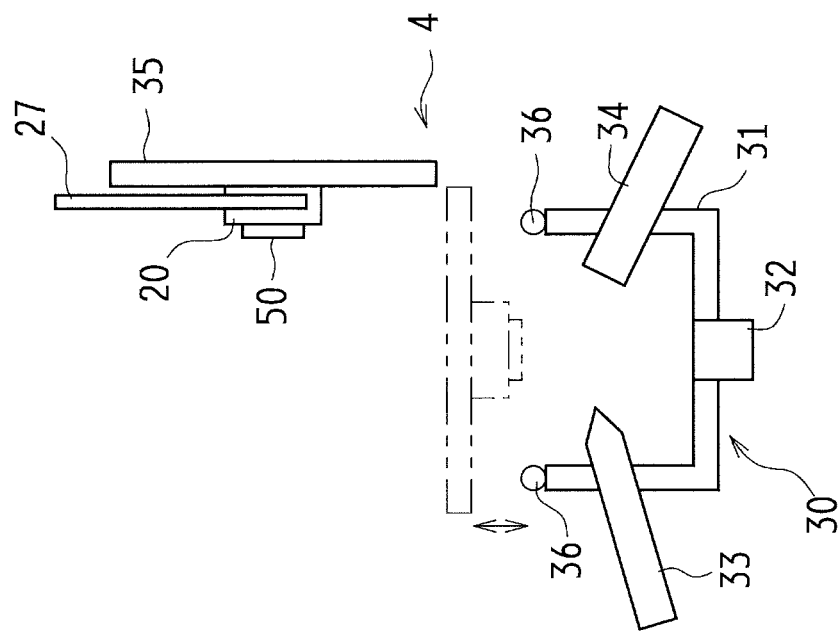
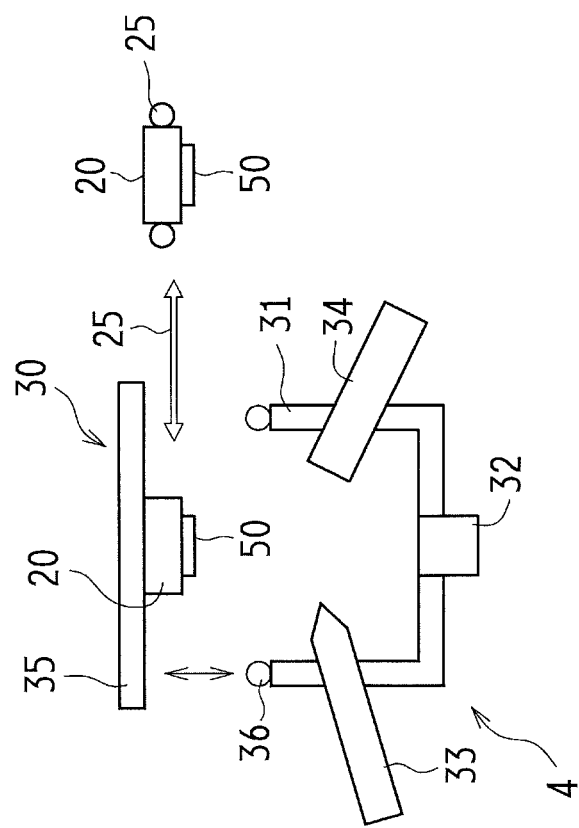

BONDING EQUIPMENT

BACKGROUND

1. Field

The present disclosure relates to bonding equipment which bonds a chip onto a substrate.

2. Description of the Related Art

A semiconductor device represented by a large scale integrated circuit (hereinafter, referred to as LSI) is usually mounted on a printed substrate or the like to be used. Another semiconductor chip is mounted on the LSI formed on a silicon wafer and a device in which the LSI and the semiconductor chip are combined functions as a system, so that it is possible to incorporate more complicated functions into one device. A flip chip mounting technique is known as a technique for mounting the semiconductor chip on the wafer. For example, International Publication No. 2013/161891 discloses bonding equipment for bonding the semiconductor chip on the wafer by flip chip bonding.

In a process of bonding a micro LED on an LSI on which a driving circuit is formed and manufacturing a minute display device for image projection, in some cases, on a wafer on which the driving circuit LSI is formed, a micro LED array which is a light-emitting portion is bonded and a wavelength conversion pattern or a color filter pattern used for color display is further formed. A size of one micro LED is approximately several µm to 50 µm, and the number of micro LEDs to be bonded is several ten thousand to several million. Therefore, the number of bonding points on one LSI is at least several ten thousand to several million, and a size of the bonding point is approximately 1 µm to approximately 10 µm for a small one.

When forming such chip/wafer bonding, the following problem occurs. That is, the micro LEDs are desired to be formed into a chip in units of display elements, and the chip forming process includes a process of polishing a rear surface of a growth substrate, braking the growth substrate, or the like, so dust is generated. Therefore, a large amount of dust adheres to the micro LED after the chip forming process. Since the chip is stored in a tray in many cases and the chips may not be completely fixed in the tray, dust is easily generated during conveyance or the like of the tray and adhesive dust increases. In a case where the chip is managed in a wafer state, the chip is bonded to an adhesive sheet, and an adhesive glue may adhere to the chip in some cases. In either case, dust management is difficult in the process to be in the chip state, and there is a problem that adhesion of various foreign matters may not be avoided.

Further, if a chip to which a large amount of dust or a large number of foreign matters adhere is bonded to a wafer by using existing bonding equipment, dust adheres to a bonding surface and causes a large number of bonding defects, which is a factor of reducing a bonding yield. Since the bonding defect is conspicuous as an electrode size to be bonded becomes smaller and the number of bonded electrodes increases, the bonding defect is a major problem in production of the display element of the micro LED.

It is desirable to provide bonding equipment capable of suppressing adhesion of dust to a bonding surface and performing appropriate bonding, and realizing a high yield when bonding a chip, a substrate, and the like having a large number of electrodes to be bonded and small-size electrodes.

SUMMARY

According to an aspect of the disclosure, there is provided bonding equipment for bonding a chip having a first electrode and a substrate having a second electrode so that the first electrode and the second electrode are electrically connected to each other, the bonding equipment including: a laminar flow source for generating a laminar flow in which dust is removed; a chip handling portion for picking the chip up; a cleaning portion for cleaning the chip; a bonding portion which includes a bonding stage for bonding the chip and the substrate; and a transfer mechanism for transferring the chip from the chip handling portion to the bonding portion, in which at least the cleaning portion and the bonding portion are provided in the laminar flow.

BRIEF DESCRIPTION OF THE DRAWINGS

FIG. 2 is a top view illustrating the bonding equipment according to the first embodiment of the present disclosure;

FIGS. 3A and 3B are cross-sectional views illustrating a configuration of a cleaning portion in the bonding equipment according to the first embodiment of the present disclosure;

FIG. 6 is a front view illustrating bonding equipment according to a third embodiment of the present disclosure;

FIGS. 10A and 10B are cross-sectional views illustrating a configuration of a cleaning portion in the bonding equipment according to the fourth embodiment of the present disclosure;

DESCRIPTION OF THE EMBODIMENTS

Hereinafter, bonding equipment according to embodiments of the present disclosure will be described with reference to drawings.

First Embodiment

Figure 1:
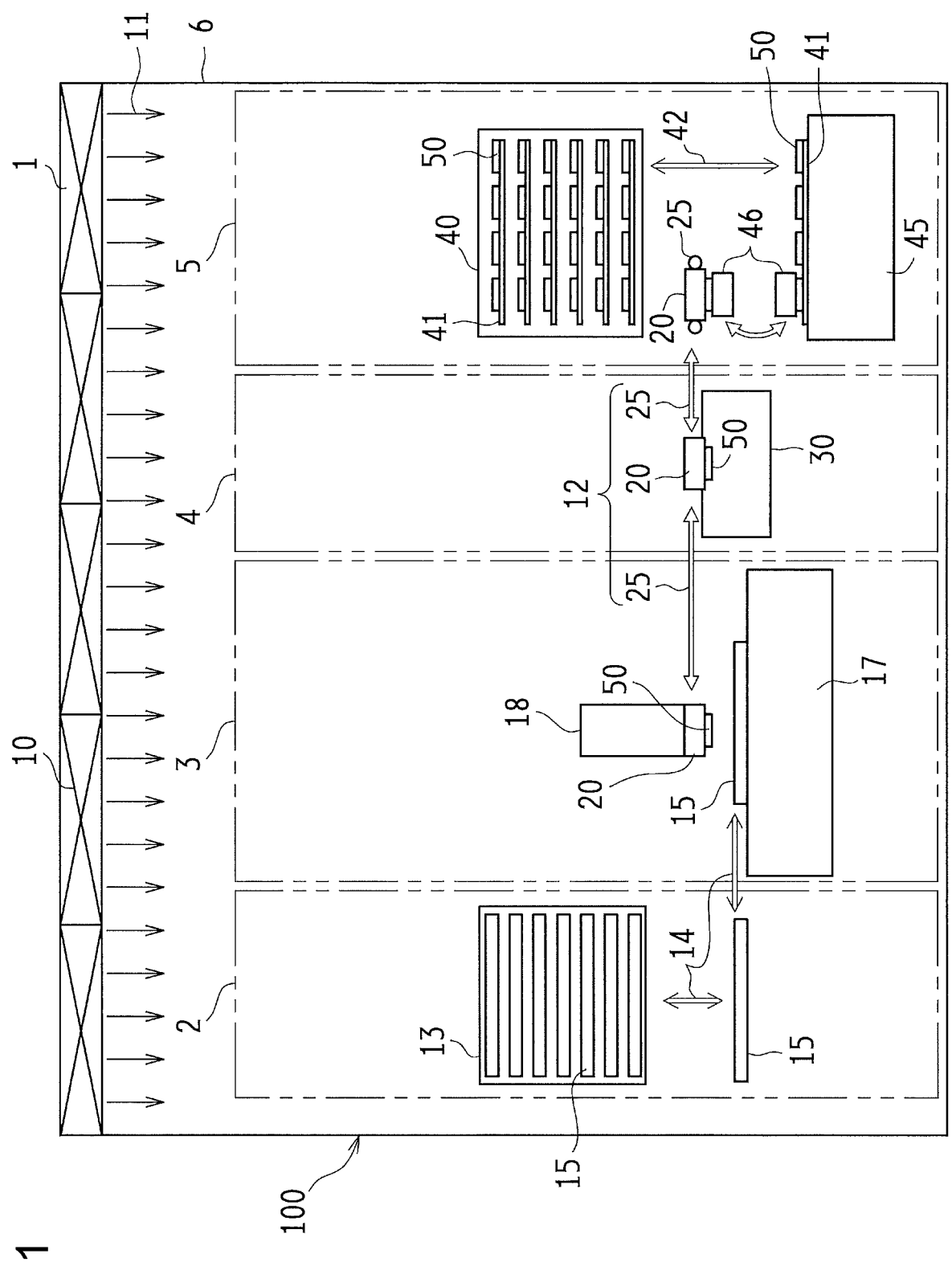
FIG. 1 is a front view illustrating bonding equipment according to a first embodiment of the present disclosure.

FIG. 1 illustrates bonding equipment 100 according to the first embodiment of the present disclosure and is a front view illustrating the bonding equipment 100. FIG. 2 is a top view illustrating the bonding equipment 100, and FIGS. 3A and 3B are cross-sectional views illustrating a configuration of a cleaning portion 4 in the bonding equipment 100. In addition, FIGS. 12A to 12D are cross-sectional views schematically illustrating a bonding state of a substrate and a chip.

Each of the drawings referred to in the following description is a schematic explanatory view illustrating a configuration of the bonding equipment 100 according to the present disclosure, for simplicity, a specific form such as a housing, a transfer portion, or the like will be omitted. In the cross-sectional view in FIGS. 3A and 3B or the like, the cleaning portion 4 in the bonding equipment 100 is schematically illustrated by a cross section, and in order to make the drawing easier to see, hatching illustrating the cross section is omitted in configuration members. The same applies to the respective drawings of FIG. 12A to FIG. 12D.

The bonding equipment 100 is used for bonding a chip 50 such as a semiconductor chip or the like onto a substrate 15 such as a wafer as a substrate. A large number of circuit elements (not illustrated) are formed on the substrate 15. A large number of electrodes (a substrate electrode 15E illustrated in FIG. 12A and a second electrode) are exposed on a surface of the substrate 15. The chip 50 includes an electrode (a chip electrode 50E illustrated in FIG. 12A, a first electrode), and is bonded to each of circuit elements of the substrate 15. The chip electrode 50E is electrically connected (flip-chip connected) to the substrate electrode 15E.

As illustrated in FIG. 1, the bonding equipment 100 is configured to include a substrate handling portion 2, a bonding portion 3, the cleaning portion 4, a chip handling portion 5, a housing 6, and the like.

The substrate handling portion 2 receives the substrate 15 to be bonded, supplies the substrate 15 to the bonding portion 3, and draws out the bonding-completed substrate 15. Generally, the substrate 15 is set in the bonding equipment 100 in a state of being stored in a substrate cassette 13, and after the prescribed substrate 15 in the substrate cassette 13 is processed, the substrate cassette 13 is taken out. Although not illustrated, the substrate handling portion 2 includes a substrate transfer tool 14 for transferring the substrate 15 and an alignment tool for determining a position or a direction of the substrate 15.

The chip handling portion 5 includes a chip carrier 40 having a large number of chips 50, a chip pickup stage 45 for picking the chip 50 up, a pickup head 46 for delivering the chip 50, and the like. The chip handling portion 5 is a preparation portion which receives the chip carrier 40 for carrying a chip holding material 41 and supplies the chip 50 in the chip carrier 40 to the bonding portion 3. The chip holding material 41 is a material which holds a plurality of chips 50, and a tray, an adhesive sheet, or the like is used, for example. For example, a tray cassette, a reel, an adhesive sheet cassette or the like is used as the chip carrier 40.

The bonding portion 3 is a device which presses and bonds the chip 50 onto the substrate 15 set on a bonding stage 17. The chip 50 is transferred from the chip handling portion 5 to the bonding portion 3 by a transfer mechanism 12.

The transfer mechanism 12 is provided with a bonding head 20 which chucks the chip 50 and a transfer hand 25. In the chip handling portion 5, the bonding head 20 holds the chip 50 and is transferred from the chip handling portion 5 by the transfer hand 25. In the bonding portion 3, a head driving portion 18 for driving the bonding head 20 is connected to the bonding head 20.

The bonding head 20 includes a chucking part which chucks the chip 50, and may further include a heat source for heating the chip 50, an antenna function for supplying an ultrasonic wave to the chip 50, and the like. In addition to having a function of transferring the bonding head 20, the head driving portion 18 includes utilities such as a power supply and a vacuum source for holding and driving the bonding head 20.

In order to receive supply of the utilities such as the power supply, the vacuum source, and the like from the head driving portion 18, the bonding head 20 includes a utility connection portion on a surface opposite to a surface for chucking the chip 50. Specifically, the utility connection portion is a connector for connecting the power supply, a coupler for connecting the vacuum source, or the like. The chip 50 chucked by the bonding head 20 is bonded to the substrate 15 on the bonding stage 17 by the head driving portion 18.

The bonding stage 17 includes a hold surface which chucks and fixes the substrate 15 by a vacuum chuck or an electro-static chuck. In this case, the hold surface of the bonding stage 17 is set in a horizontal direction, and can transfer the substrate 15 in the horizontal direction. Further, the bonding stage 17 may have a function of heating or cooling the substrate 15.

The bonding portion 3 is desired to precisely align the substrate 15 and the chip 50 and includes a position sensor which measures a positional deviation between electrodes corresponding to the substrate 15 and the chip 50. Accordingly, the bonding portion 3 has a function of feeding a signal of the position sensor back and finely adjusting a position of the bonding stage 17 or the head driving portion 18. Generally, the position sensor can measure a positional deviation by processing an image obtained from a camera using visible light or infrared light. In some cases, the camera is provided on a side of the bonding stage 17 and monitors the substrate 15 from a lower side or is provided above the bonding stage 17.

The cleaning portion 4 is provided between the bonding portion 3 and the chip handling portion 5. The cleaning portion 4 cleans and removes an adhesive matter such as dust or the like adhering to the chip 50. The cleaning portion 4 includes a cleaning chamber 30. As illustrated in FIGS. 3A and 3B, the cleaning chamber 30 includes a cleaning cup 31 in a bowl shape or a bottomed-box shape and a door 35 which closes an upper portion of the cleaning cup 31.

The cleaning cup 31 includes a cleaning agent nozzle 33 which supplies a cleaning agent and a discharge port which discharges the cleaning agent and the dust after cleaning. In the illustrated embodiment, a first cleaning agent discharge port 32 and a second cleaning agent discharge port 34 are provided as discharge ports. Of these, the first cleaning agent discharge port 32 is used for discharging the cleaning agent accumulated at a bottom portion of the cleaning cup 31, and the second cleaning agent discharge port 34 is used for discharging the cleaning agent recoiled by the bonding head 20. A seal ring 36 is disposed at a contact portion between the cleaning cup 31 and the door 35.

Each of configuration members of the bonding equipment 100 is stored in an internal space of the housing 6. The housing 6 is provided so as to surround an outer peripheral portion of the bonding equipment 100, and includes an opening and closing door (not illustrated) for drawing in and out the substrate 15 or the chip 50. When maintaining the bonding equipment 100, the opening and closing door is opened, so that the bonding equipment 100 can be partially opened. The housing 6 is desirably made of a material which avoids generation of static electricity.

In addition, the bonding equipment 100 includes a laminar flow source 1 which generates a laminar flow 11 in which dust is removed. As illustrated in FIG. 1, the laminar flow source 1 is disposed on a ceiling part of the bonding equipment 100. All of the substrate handling portion 2, the bonding portion 3, the cleaning portion 4, and the chip handling portion 5 provided in the housing 6 are provided below the laminar flow source 1 and are disposed so as to be covered by the laminar flow source 1.

The laminar flow source 1 includes a HEPA filter 10, and supplies the laminar flow 11, which passes through the HEPA filter 10 and in which dust is removed, to each of the portions such as the substrate handling portion 2 and the like. As illustrated in FIG. 1, in the bonding equipment 100 according to the present embodiment, each configuration member of the substrate handling portion 2 to the chip handling portion 5 is installed in a laminar flow of a downflow by the laminar flow source 1.

The HEPA filter 10 provided in the laminar flow source 1 removes, at least, dust of a size equal to or more than 1 μm, and also desirably removes dust of a size equal to or more than 0.1 μm. As long as the dust does not enter the cleaning portion 4 from the chip handling portion 5, the laminar flow 11 may not be supplied to the chip handling portion 5.

(Operation of Bonding Equipment 100)

In the bonding equipment 100 configured as described above, in the chip handling portion 5, the chip holding material 41 is taken out from the chip carrier 40 by a chip holding material transfer tool 42 and is positioned on the chip pickup stage 45. The chip 50 is picked up from the chip holding material 41 by the pickup head 46 and is delivered to the bonding head 20 held by the transfer hand 25. The chip pickup stage 45 includes a transfer function of transferring each of the chips 50 on the chip holding material 41 to a position of the pickup head 46.

As illustrated in FIG. 1, on the chip pickup stage 45, with respect to the chip holding material 41, the chip 50 is disposed so that an electrode surface having the chip electrode 50E (see FIG. 12A) faces upward. In this case, the pickup head 46 holds the chip 50 in contact with the electrode surface of the chip 50 by a collet or the like. In addition, the pickup head 46 transfers upward while holding the chip 50 and rotates by 180 degrees.

The bonding head 20 chucks a surface (non-electrode surface) on an opposite side of the electrode surface of the chip 50. Accordingly, the chip 50 is delivered to the bonding head 20. In a case where the electrode surface of the chip 50 is disposed downward (faces downward) on the chip holding material 41, the bonding head 20 may be used as it is as the pickup head 46 so as to chuck the non-electrode surface of the chip 50 and may be lifted as it is. In the chip handling portion 5, the bonding head 20 holding the chip 50 is transported to the cleaning chamber 30 by the transfer hand 25.

When the chip 50 is transported to the cleaning portion 4, as illustrated in FIG. 3B, the door 35 of the cleaning chamber 30 is lifted and the transfer hand 25 carries the bonding head 20 into the cleaning chamber 30. Next, the bonding head 20 is delivered from the transfer hand 25 to the door 35. The door 35 chucks the bonding head 20 by a vacuum chuck, an electro-static chuck, or the like and holds the bonding head 20. In order to rotate the bonding head 20 during cleaning, the door 35 may hold the bonding head 20 by providing a rotation table on the door 35 and chucking the bonding head 20 on the rotation table.

When the chip 50 is transferred to the door 35, the door 35 is closed. As illustrated in FIG. 3A, the door 35 is pressed against the seal ring 36, the cleaning chamber 30 is sealed, and cleaning of the chip 50 is started. The cleaning is performed by spraying a cleaning agent from the cleaning agent nozzle 33 to the chip 50 and the bonding head 20 and removing dust and the like adhering to the surface. The cleaning agent, the dust, and the like are sucked into the first cleaning agent discharge port 32 and the second cleaning agent discharge port 34 and discharged. After the cleaning, the cleaning chamber 30 may be purged with clean air, nitrogen, or the like.

Various materials and methods having a dust removal capability can be applied to the cleaning agent and the cleaning method in the cleaning portion 4. For example, a dry ice scrub for spraying a dry ice particle, clean air blowing, a combination of alkaline chemical and an ultrasonic wave, an organic solvent, and the like, or combinations of a plurality of these can be used. Therefore, the number of the cleaning agent nozzles 33 provided in the cleaning chamber 30 is not limited to one, but a plurality of cleaning agent nozzles 33 may be provided, or a purging nozzle may be included. In the same manner, a plurality of first cleaning agent discharge port 32 and second cleaning agent discharge port 34 may be provided.

When the cleaning of the chip 50 is completed, the bonding head 20 is carried out from the cleaning chamber 30 by a route opposite to a route at the time of the transfer. Accordingly, it is possible to remove the dust and the like adhering to, both the chip 50 and the bonding head 20.

The bonding head 20 holding the chip 50 is transported to the bonding portion 3 by the transfer hand 25. As illustrated in FIGS. 1 and 2, in the bonding portion 3, the bonding head 20 is attached to the head driving portion 18, and a bonding process between the chip 50 and the substrate 15 is performed.

The bonding head 20 is desired to keep holding the chip 50 during the bonding process. For example, in a case where the holding of the chip 50 is performed by a vacuum chuck, the transfer hand 25 can consistently hold the bonding head 20 and continue to supply vacuum from the transfer hand 25. Alternatively, a tube for vacuum supply may be directly connected to the bonding head 20. In the same manner, also in a case where the chip 50 is held by an electro-static chuck, electro-static supply can be performed from the transfer hand 25. Alternatively, the electro-static chuck may be functioned only for the bonding head 20 by attaching a capacitor to the bonding head 20 and charging the capacitor.

On the bonding stage 17, the substrate electrode 15E of the substrate 15 and the chip electrode 50E of the chip 50 are connected, and the substrate 15 and the chip 50 are bonded. As a connection method, a gold-gold connection for connecting a gold bump to a gold electrode, a connection for disposing an anisotropic conductive film (ACF) or an anisotropic conductive resin between the electrodes, a connection by a combination of bump and nonconductive polymer (NCP), a connection by nanoparticles, and the like can be used. On the substrate electrode 15E of the substrate 15, in accordance with such various connection methods, a connection material 60 such as an arrangement of bumps or nanoparticles, an ACF bonding, or an application of NCP, or the like is prepared.

In the substrate handling portion 2, a process of forming the connection material 60 may be performed. The substrate handling portion 2 includes a function of forming the connection material 60, so that it is possible to shorten a time from the formation of the connection material 60 to the connection. Thus, it is possible to suppress a change over time of the connection material 60. Therefore, it becomes ease to manage quality of the connection material 60. In addition, the connection material 60 having a short lifetime also can be used, and a selection range of the connection material 60 is expanded. As a result, for example, there is an advantage that a manufacturing cost can be reduced by using the inexpensive connection material 60.

(Dust Management)

Next, in the bonding equipment 100, dust management for suppressing adhesion of dust to a bonding surface and enabling appropriate bonding will be described.

Since dust management is performed in a manufacturing process of the substrate 15, the amount of dust adhering to the surface of the substrate 15 from the first is not large and the dust of the substrate 15 is difficult to become an enormous problem. On the other hand, since dust adheres due to various causes in a step in which the chip 50 is brought into the chip handling portion 5, if the bonding process is performed as it is, a bonding defect occurs and the bonding between the substrate 15 and the chip 50 may have a low yield.

Here, a type of dust and a defect mode will be described with reference to FIGS. 12A to 12D.

Figure 12A:
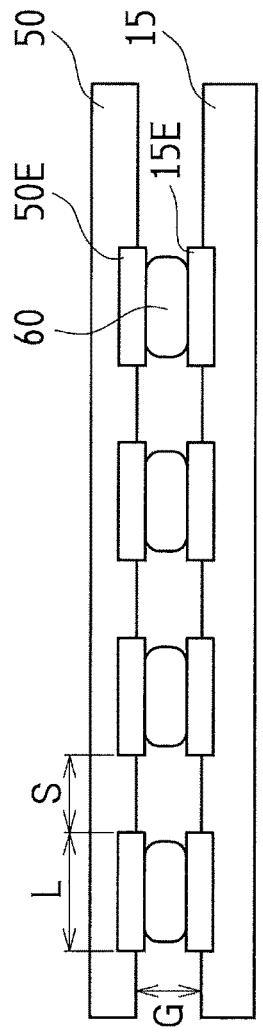
FIGS. 12A, 12B, 12C, and 12D are cross-sectional views schematically illustrating an example of a bonding state of a substrate and a chip.

FIG. 12A illustrates an appropriate bonding state between the substrate 15 and the chip 50. The substrate electrode 15E is formed on the substrate 15 and the chip electrode 50E is formed on the chip 50 with an electrode size L, and an electrode space S is secured as a space between adjacent electrodes. The substrate electrode 15E and the chip electrode 50E are connected with the connection material 60 interposed therebetween. The substrate 15 and the chip 50 are bonded in a state in which a gap G is formed therebetween. The ideal gap G is a sum of a thickness of the connection material 60, a height of the substrate electrode 15E from the surface of the substrate 15, and a height of the chip electrode 50E from the surface of the chip 50.

Figure 12B:
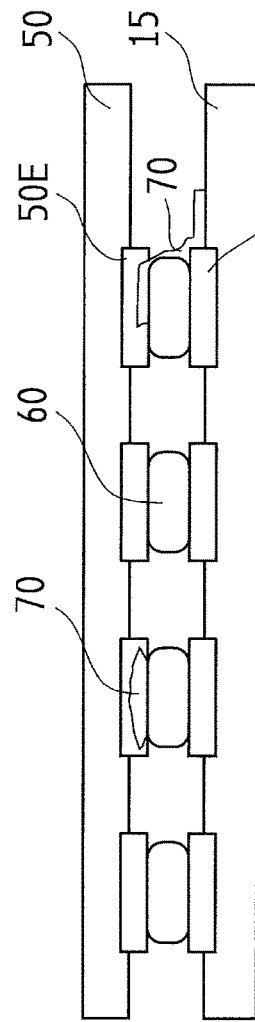

FIG. 12B illustrates a bonding state in a case where dust 70 adheres to the chip 50. In this case, insulating dust of a size equal to or larger than the electrode size (short side or short diameter) L adheres between the chip 50 and the substrate 15. Accordingly, connection failure occurs between the substrate electrode 15E and the chip electrode 50E.

Figure 12C:
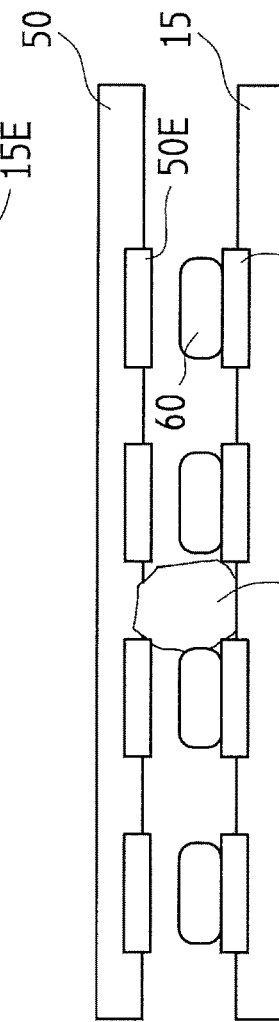

FIG. 12C illustrates a bonding state in a case where the dust 70 adheres between the chip electrodes 50E. Since the dust 70 has a larger diameter than the gap (3, an excessive space is formed between the substrate 15 and the chip 50. Accordingly, connection failure occurs between the large number of substrate electrodes 15E and chip electrodes 50E, or the chip 50 is cracked.

Figure 12D:
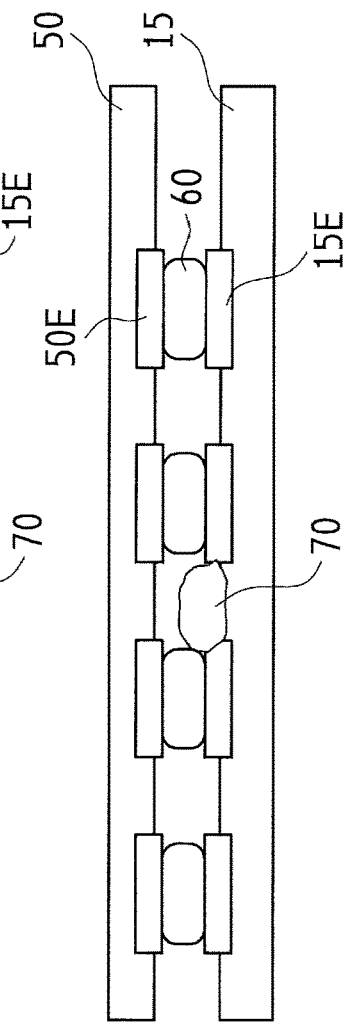

FIG. 12D illustrates a bonding state in a case where the conductive dust 70 having a width equal to or larger than the electrode space S adheres to the chip 50. In this case, a short circuit occurs between the substrate electrodes 15E due to the conductive dust 70 and connection failure occurs.

In order to avoid the connection failure as illustrated in FIGS. 12B to 12D, it is desired to reduce dust larger than a minimum value of the electrode size L, the electrode space S, and the gap G as a guide. The electrode size L and the electrode space S are approximately 1 μm to several ten μm, and the gap G is approximately several hundred nm to several ten μm. Therefore, in the bonding equipment 100, it is desirable to take measures to dust having a size of several hundred nm or larger. In addition, by bonding the substrate 15 and the chip 50 after reducing the dust, it becomes possible to increase a bonding yield.

For this purpose, the following technical items (1) to (3) are decisive.

(1) An atmosphere in the bonding equipment 100 is kept clean, and adhesion of dust from the outside of the bonding equipment 100 to the substrate 15 or the chip 50 is avoided.

(2) In the cleaning portion 4, the dust adhering to the electrode surface of the chip 50 is removed.

(3) Generation of dust inside the bonding equipment 100 is avoided and adhesion of the generated dust to the surface of the substrate 15 is avoided.

As examined, in the bonding equipment 100 of the present embodiment, since an entire body is surrounded by the housing 6 and an inside of the entire body is immersed in the laminar flow 11, invasion of dust from the outside into the bonding equipment 100 is avoided. Therefore, the technical item (1) is achieved.

In addition, by providing the cleaning portion 4, it is possible to remove dust adhering to the chip 50 and dust adhering to the bonding head 20 holding the chip 50. Therefore, the technical item (2) is achieved.

Next, generation of dust inside the bonding equipment 100 will be examined. Generally, a side surface of the chip 50 is a cracked surface, and the non-electrode surface is not smoothly polished. Therefore, if there is contact with the chip 50, dust is likely to be generated, and the dust may be generated each time the chip 50 is held or dechucked.

In the present embodiment, since the chip 50 is transferred in a state of being chucked to the bonding head 20, no new object is in contact with the chip 50 after the pickup head 46 picks the chip 50 up and delivers the chip 50 to the bonding head 20. In this manner, by transferring the chip 50 by using the bonding head 20 without directly being in contact with the chip 50 itself, it becomes possible to considerably suppress generation of dust. A material and a surface condition of the bonding head 20 can be configured so that the dust is hardly generated by, for example, mirror polishing or the like. Further, by a measure such as using a resin material which hardly generates dust also for a contact portion of the transfer hand 25 in contact with the bonding head 20, it is possible to considerably reduce generation of dust as compared with a case where the chip 50 is directly held.

Since the pickup head 46 directly holds the chip 50 by a collet or the like and delivers the chip 50 to the bonding head 20, adhesion of dust may not be avoided. Since the dust easily adheres also to the bonding head 20 when receiving the chip 50, it can be said that cleaning of the bonding head 20 is decisive.

In the present embodiment, since not only the chips 50 but also the bonding heads 20 are cleaned in the cleaning portion 4, it is possible to reduce dust adhering to the bonding head 20 in the chip handling portion 5.

In some cases, dust adheres to a surface of the bonding head 20 by being in contact with the chip 50, and it is apprehended that the dust falls onto the substrate 15 after bonding of the chip 50. Therefore, the surface of the bonding head 20 is desirably cleaned at a prescribed frequency. In this point, in the present embodiment, it is also possible to clean the surface of the bonding head 20 after bonding, in the cleaning portion 4. Therefore, the technical item (3) is also achieved.

As described above, in the bonding equipment 100 according to the present embodiment, since the dust management is achieved, adhesion of the dust to the bonding surface between the substrate 15 and the chip 50 can be suppressed and appropriate bonding is achievable.

In addition, the bonding equipment in the related art is a device in which electrodes of several thousand involved in connection of circuit elements or chips of this type of substrate are bonding targets, but in the bonding equipment 100, even when the number of electrodes involved in the connection of circuit elements of the substrate 15 or the chip 50 exceeds 10,000 and the electrode size L illustrated in FIG. 12A is small, the electrode can be a bonding target. For example, in the bonding equipment 100 according to the present embodiment, even in a case where the electrode size L is equal to or less than 20 μm, the electrode can be a bonding target.

The present embodiment is configured to include one transfer hand 25 as the transfer mechanism 12 of the chip 50, but a plurality of transfer hands 25 may be provided such as one between the cleaning portion 4 and the chip handling portion 5 and one between the cleaning portion 4 and the bonding portion 3. In addition, as the transfer mechanism 12 of the chip 50, a continuous transfer mechanism by a conveyer or the like having a plurality of transfer hands 25 also may be provided.

FIG. 1 illustrates that the substrate handling portion 2, the bonding portion 3, the cleaning portion 4, and the chip handling portion 5 are disposed in parallel, but considering miniaturization of the equipment, reduction of transfer equipment, ease of maintenance, and the like, various planar dispositions other than the planar disposition illustrated in FIG. 2 can be used. Further, for the purpose of improving a throughput, it is also possible to install a plurality of cleaning chambers 30 in the cleaning portion 4 to avoid a decrease in the throughput due to a rate limit in the cleaning process. Alternatively, a plurality of combinations of the bonding head 20 and the chip 50 may be simultaneously processed in one cleaning chamber 30. Further, in the bonding equipment 100 according to the present embodiment, since a plurality of bonding heads 20 are desired, a structure in which a stock portion of the bonding head 20 is provided in the housing 6 may be adopted.

Second Embodiment

Figure 4:
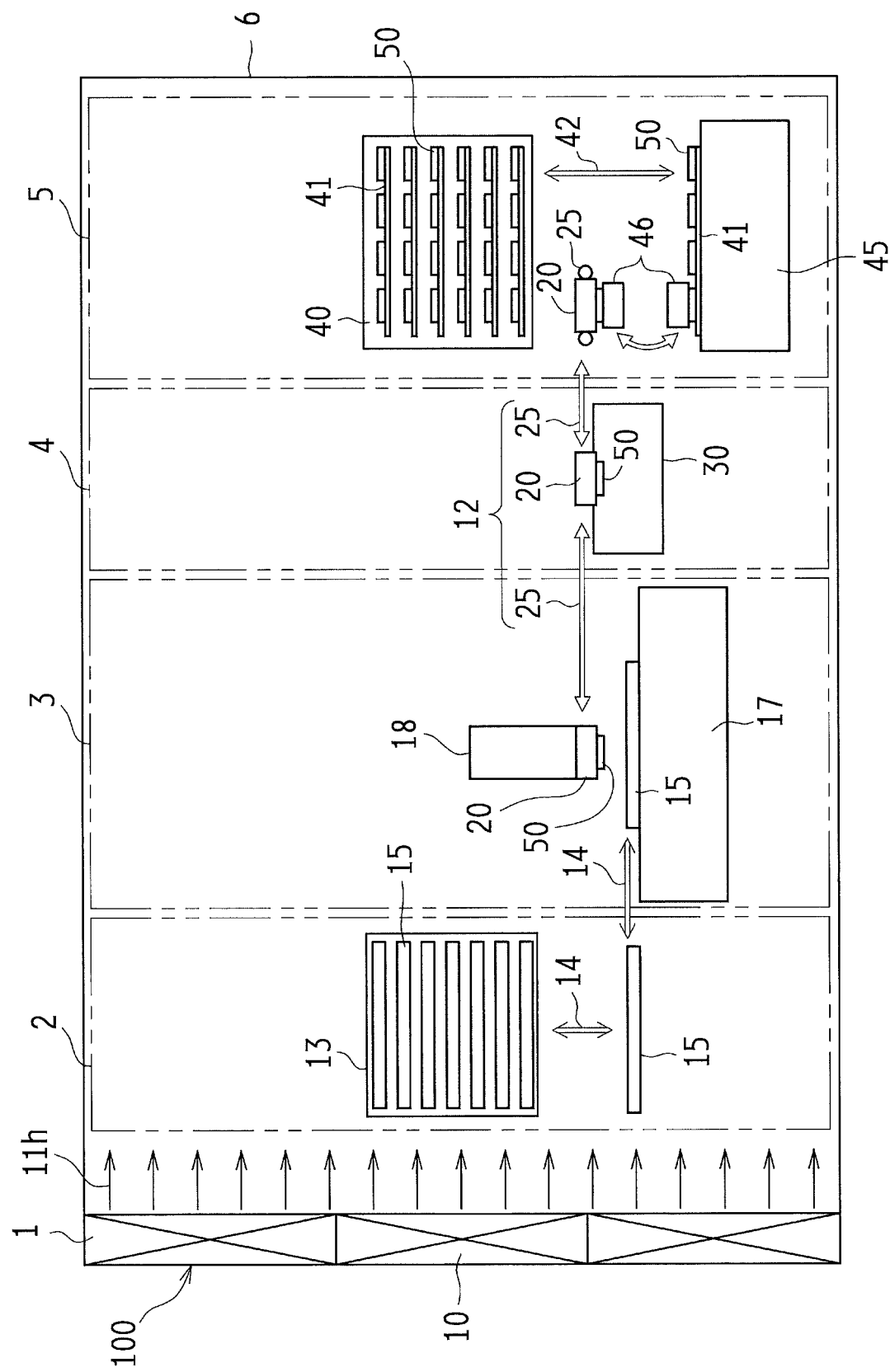
FIG. 4 is a front view illustrating bonding equipment according to a second embodiment of the present disclosure.
Figure 5:
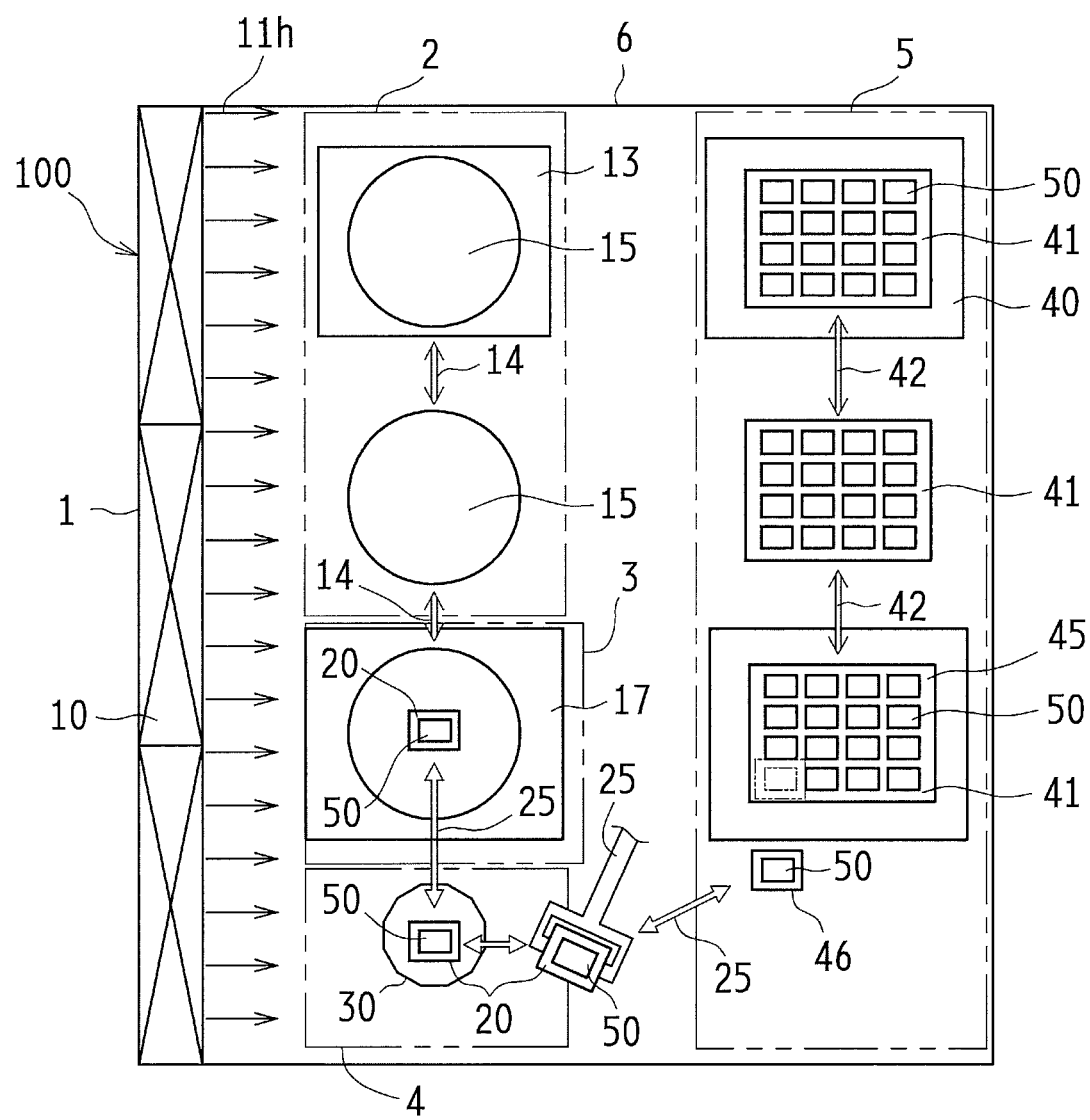
FIG. 5 is a top view illustrating the bonding equipment according to the second embodiment of the present disclosure.

FIGS. 4 and 5 illustrate the bonding equipment 100 according to the second embodiment of the present disclosure. FIG. 4 is a front view illustrating the bonding equipment 100 and FIG. 5 is a top view illustrating the bonding equipment 100.

In the embodiment described below, since the basic configuration is common with the first embodiment, the common configuration is denoted by the same reference numerals as those in the first embodiment, and a detailed description thereof will be omitted.

In the first embodiment, the laminar flow source 1 is provided on the ceiling part, and each configuration member is disposed in the laminar flow of the downflow. On the other hand, the bonding equipment 100 according to the present embodiment has a characteristic in the laminar flow source 1, and each configuration member is disposed in a horizontal laminar flow 11h.

As illustrated in FIGS. 4 and 5, the laminar flow source 1 is disposed on one side of sides of the bonding equipment 100. Each of the configuration members of the substrate handling portion 2, the bonding portion 3, the cleaning portion 4, the chip handling portion 5, and the transfer mechanism 12 is common to the bonding equipment 100 according to the first embodiment.

In this case, the substrate handling portion 2, the bonding portion 3, and the cleaning portion 4 are desirably disposed in order from an upstream side of the horizontal laminar flow 11h. The horizontal laminar flow 11h is formed in the housing 6. When up-and-down movement of the head driving portion 18 in the bonding process or a transfer of dechucking the bonding head 20 from the head driving portion 18 after completion of the bonding, dust is liable to fall. However, in the bonding equipment 100 according to the present embodiment, since the bonding portion 3 and the like are disposed in the horizontal laminar flow 11h, it becomes possible to clean the dust away and to avoid the dust from falling or adhering to the surface of the substrate 15 even if the dust falls. In addition, while transferring the chip 50 from the chip handling portion 5 to the bonding portion 3 via the cleaning portion 4, the electrode surface (downward) of the chip 50 is flowed away by the horizontal laminar flow 11h. Therefore, it becomes possible to avoid adhesion of the dust during the transfer of the chip 50.

According to the bonding equipment 100 of the present embodiment, it is possible to considerably reduce the amount of dust which is interposed on the bonding surface of the substrate 15 and the chip 50 and causes a bonding defect, and to improve a bonding yield between the substrate 15 and the chip 50.

Third Embodiment

Figure 7A:
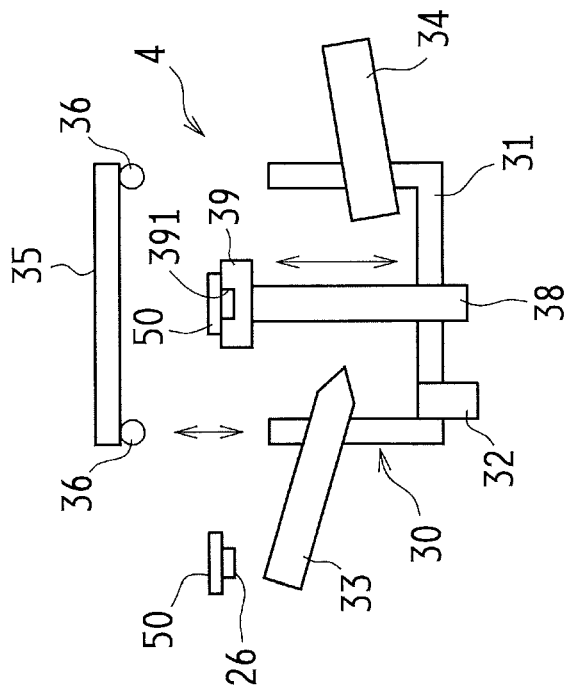
FIGS. 7A and 7B are cross-sectional views illustrating a configuration of a cleaning portion in the bonding equipment according to the third embodiment of the present disclosure.
Figure 7B:
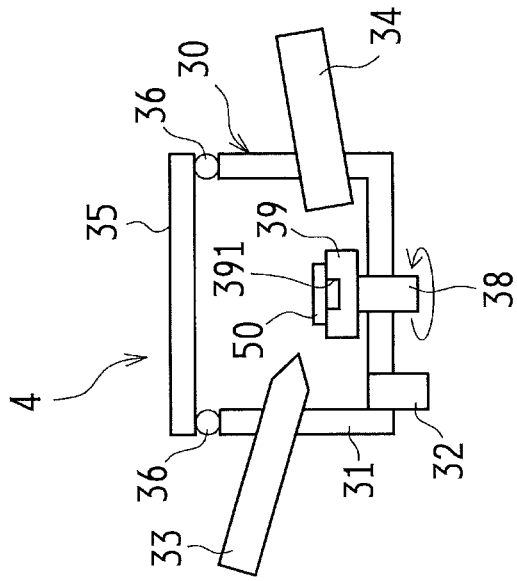

FIGS. 6, 7A, and 7B illustrate the bonding equipment 100 according to the third embodiment of the present disclosure. FIG. 6 is a front view and FIGS. 7A and 7B are cross-sectional views illustrating the cleaning portion 4.

The bonding equipment 100 according to the third embodiment has a characteristic in a transfer method of the chip 50 and the cleaning chamber 30, as compared with the bonding equipment 100 according to the first embodiment. That is, in the first embodiment, the chip 50 is configured to be transferred and cleaned in a state of being chucked to the bonding head 20, but in the present embodiment, the chip 50 is configured to transferred and cleaned by itself. Such a configuration is suitable for a case where the chip 50 is relatively large, or a case where the non-electrode surface of the chip is smoothly polished and dust generation is small.

The bonding equipment 100 includes a transfer hand (a second transfer hand) 26 as the transfer mechanism 12. As illustrated in an enlarged view of a portion a in FIG. 6, the transfer hand 26 includes a chucking part 261 which chucks a non-electrode surface (a surface not having the chip electrode 50E) in the chip 50.

The chucking part 261 is provided at a tip portion of the transfer hand 26 and is formed to have a width narrower than a chip width (a length in the right-and-left direction in each of the drawings of FIG. 12A to FIG. 12D). In the illustrated embodiment, the transfer hand 26 has a fine and thin spatula overall shape, and is configured to chuck the chip 50 with a vacuum chuck or an electro-static chuck by the chucking part 261.

The transfer hand 26 holds and transfers the chip 50, and dechucks the chip 50 at a prescribed position. The chip 50 is transferred in a state of being chucked by the transfer hand 26 in a fine spatula shape. The transfer hand 26 transfers between the chip handling portion 5, the cleaning portion 4, and the bonding portion 3 and dechucks the transferred chip 50.

Corresponding to the transfer hand 26, the pickup head 46 of the chip handling portion 5 is provided with a groove 461 into which the tip portion of the transfer hand 26 can be inserted. In addition, the bonding head 20 disposed in the bonding portion 3 is also provided with a groove 201 into which the tip portion of the transfer hand 26 can be inserted.

In the cleaning portion 4, in the cleaning chamber 30, the chip 50 is dechucked from the transfer hand 26 and is directly cleaned. As illustrated in FIG. 7A, the cleaning chamber 30 of the cleaning portion 4 includes a cleaning stage 39 which receives the chip 50 from the transfer hand 26 and holds the chip 50, and a support column 38 which supports the cleaning stage 39 in the cleaning chamber 30. The cleaning stage 39 is disposed inside the cleaning cup 31 and provides the chip 50 on the cleaning stage 39 to cleaning. A groove 391 into which the tip portion of the transfer hand 26 can be inserted is provided on an upper surface of the cleaning stage 39. The support column 38 is stood on a bottom portion of the cleaning cup 31 and provided so as to be expandable and contractible in an up-and-down direction.

When the chip 50 is transferred to the cleaning portion 4, the door 35 is opened as illustrated in FIG. 7B, and the support column 38 lifts the cleaning stage 39 above the cleaning cup 31. The chip 50 transferred to the cleaning stage 39 by the transfer hand 26 is dechucked from the transfer hand 26 and is set on the cleaning stage 39. The cleaning stage 39 chucks and fixes the non-electrode surface of the chip 50.

When a transfer of the chip 50 is completed, the cleaning stage 39 returns to a bottom portion of the cleaning chamber 30, the door 35 is closed, and cleaning is started. The configuration in which the cleaning chamber 30 is hermetically sealed by the seal ring 36, the configuration in which the cleaning agent nozzle 33, the first and second cleaning agent discharge ports 32 and 34, and the like are included are the same as in the first embodiment, but a disposition direction of the cleaning agent nozzle 33 and the second cleaning agent discharge port 34 is desirably changed in accordance with the cleaning performed at the bottom of the cleaning cup 31. The support column 38 may have a rotation function in addition to the function of raising and lowering the cleaning stage 39.

From the chip handling portion 5 to the cleaning portion 4, the transfer hand 26 is inserted into the groove 461 of the pickup head 46, is chucked to the non-electrode surface of the chip 50 to lift the chip 50, and carries the chip 50 to the cleaning chamber 30 of the cleaning portion 4. At this time, the electrode surface of the chip 50 faces upward. After the cleaning in the cleaning portion 4, the chip 50 is delivered from the cleaning chamber 30 to the bonding head 20. At this time, the transfer hand 26 is horizontally transferred, rotates by 180 degrees, and inverts the chip 50 to change the electrode surface of the chip 50 downward. In the bonding portion 3, the transfer hand 26 is inserted into the groove 201 of the bonding head 20 fixed to the head driving portion 18, and after the chip 50 is delivered to the bonding head 20, the transfer hand 26 is dechucked.

According to the bonding equipment 100 of the present embodiment, it is possible to considerably reduce the amount of dust which is interposed on the bonding surface of the substrate 15 and the chip 50 and causes a bonding defect, and to improve a bonding yield between the substrate 15 and the chip 50.

Fourth Embodiment

Figure 8:
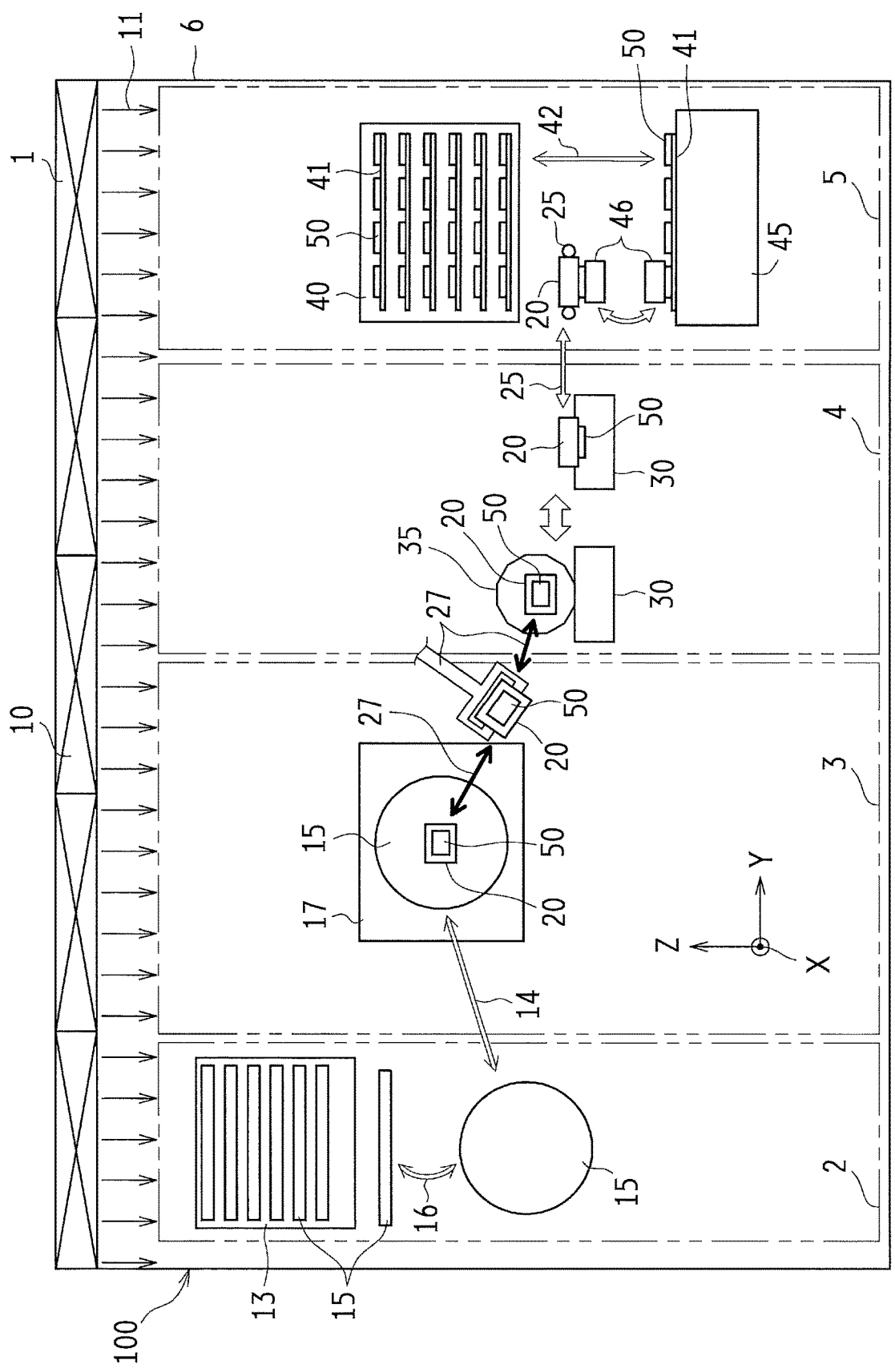
FIG. 8 is a front view illustrating bonding equipment according to a fourth embodiment of the present disclosure.
Figure 9:
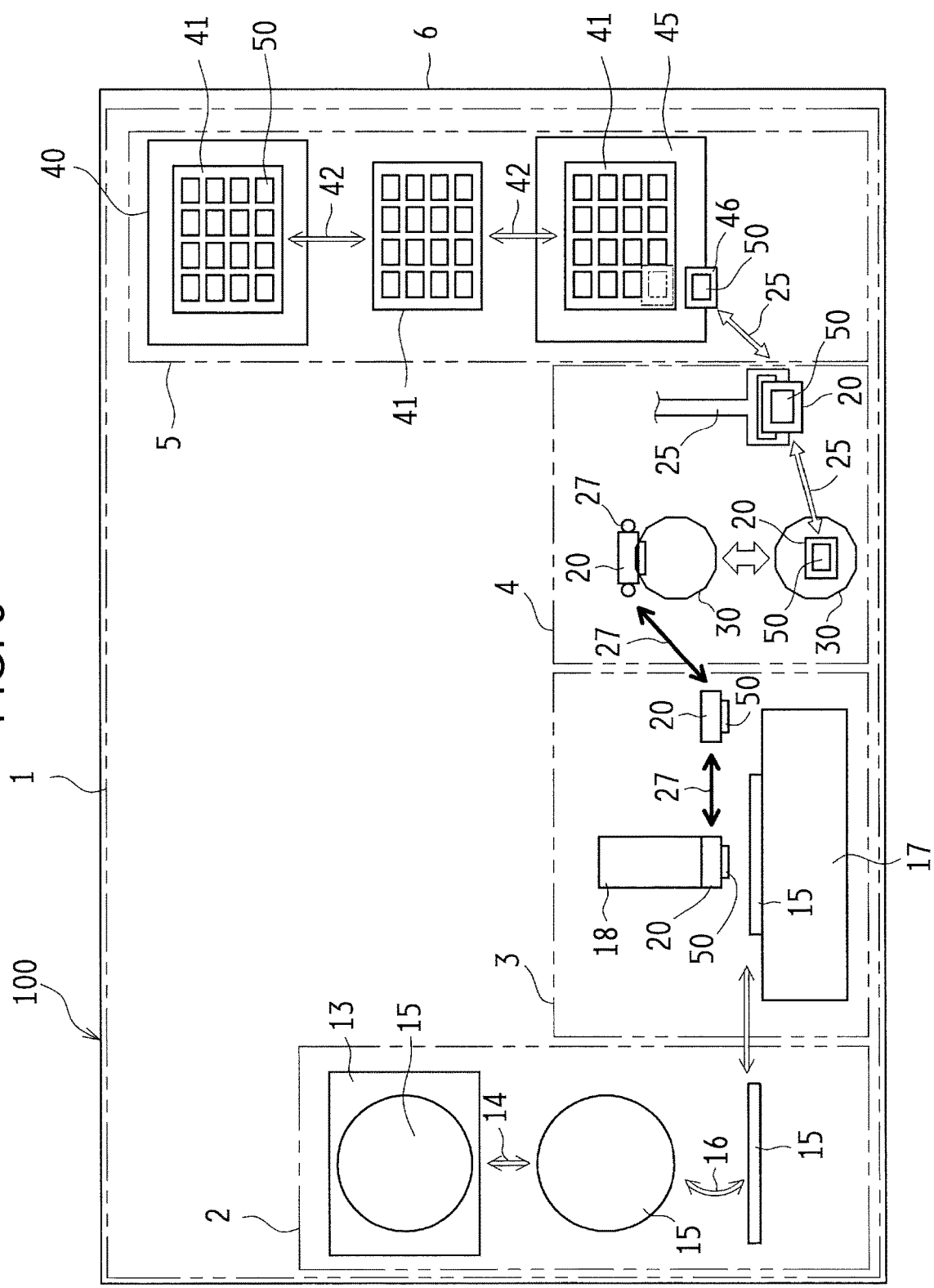
FIG. 9 is a top view illustrating the bonding equipment according to the fourth embodiment of the present disclosure.

FIG. 8 is a front view illustrating the bonding equipment 100 according to the fourth embodiment of the present disclosure, and FIG. 9 is a top view. FIGS. 10A and 10B are cross-sectional views illustrating a configuration of the cleaning portion 4.

The bonding equipment 100 according to the fourth embodiment has a characteristic in that the substrate 15 is bonded to the chip 50 in a state in which the substrate 15 stands, as compared with the bonding equipment 100 according to the first embodiment. That is, in the present embodiment, for example, the dust reduction function described in the second embodiment is realized while using the laminar flow 11 of the downflow by the laminar flow source 1 described in the first embodiment.

As illustrated in FIGS. 8 and 9, the substrate handling portion 2 includes a substrate rotation portion 16 which rotates the substrate 15 from a horizontal direction (a Y-axis direction in FIG. 8) to a perpendicular direction (a Z-axis direction in FIG. 8). The substrate transfer tool 14 transfers the substrate 15 in a standing state in the perpendicular direction to the bonding stage 17 of the bonding portion 3 between the substrate handling portion 2 and the bonding portion 3.

In the bonding portion 3, the hold surface of the bonding stage 17 is set in the perpendicular direction (a direction parallel to a Y-Z plane), and the substrate 15 can be held in parallel to the Z-axis and can be transferred in the perpendicular direction. As illustrated in FIG. 9, the head driving portion 18 is disposed in the X-axis direction and is transferable in the X-axis direction.

As illustrated in FIG. 8, a perpendicular transfer hand 27 is provided between the cleaning portion 4 and the bonding portion 3. While the transfer hand 25 carries the bonding head 20 in the horizontal direction, the perpendicular transfer hand 27 carries the bonding head 20 in a state in which the bonding head 20 stands in the perpendicular direction. The other configuration of the perpendicular transfer hand 27 is common to the transfer hand 25.

In the cleaning portion 4, as illustrated in FIG. 10B, the door 35 is configured to be able to rotate by 90 degrees and to be opened from a state in which the door 35 is perpendicularly transferred upward. That is, the door 35 is rotatable from the horizontal direction to the perpendicular direction. As illustrated in FIG. 10A, the cleaning chamber 30 receives the bonding head 20 held by the transfer hand 25, and chucks and holds the bonding head 20 to the door 35.

After cleaning the chip 50 and the bonding head 20, as illustrated in FIG. 10B, the perpendicular transfer hand 27 holds the bonding head 20 in a state in which the door 35 is open, and carries the bonding head 20 to the head driving portion 18 of the bonding portion 3. In this configuration, since a direction (the perpendicular direction) of the bonding head 20 between the bonding portion 3 and the cleaning portion 4 is different from a direction (the horizontal direction) of the bonding head 20 between the cleaning portion 4 and the chip handling portion 5, a mechanism for changing the direction of the bonding head 20 is desired. In the present embodiment, by using an opening and closing operation of the cleaning portion 4, the direction of the bonding head 20 is changed, so that there is an advantage that it is not desired to provide another mechanism.

The electrode surface of the substrate 15 or the chip 50 is consistently flowed away by the laminar flow 11 of the downflow, and is kept ordinarily by avoiding adhesion of dust. Even if the dust is generated from the surface of the head driving portion 18 or the bonding head 20, the surface is flowed away by the downflow of the laminar flow 11, and it is possible to avoid adhesion to the surface of the substrate 15.

Therefore, also with the bonding equipment 100 of the present embodiment, it is possible to considerably reduce the amount of dust which is interposed on the bonding surface of the substrate 15 and the chip 50 and causes a bonding defect, and to improve a bonding yield between the substrate 15 and the chip 50. The configuration according to the present embodiment is also applied effectively for large dust which is affected by gravity.

Fifth Embodiment

Figure 11:
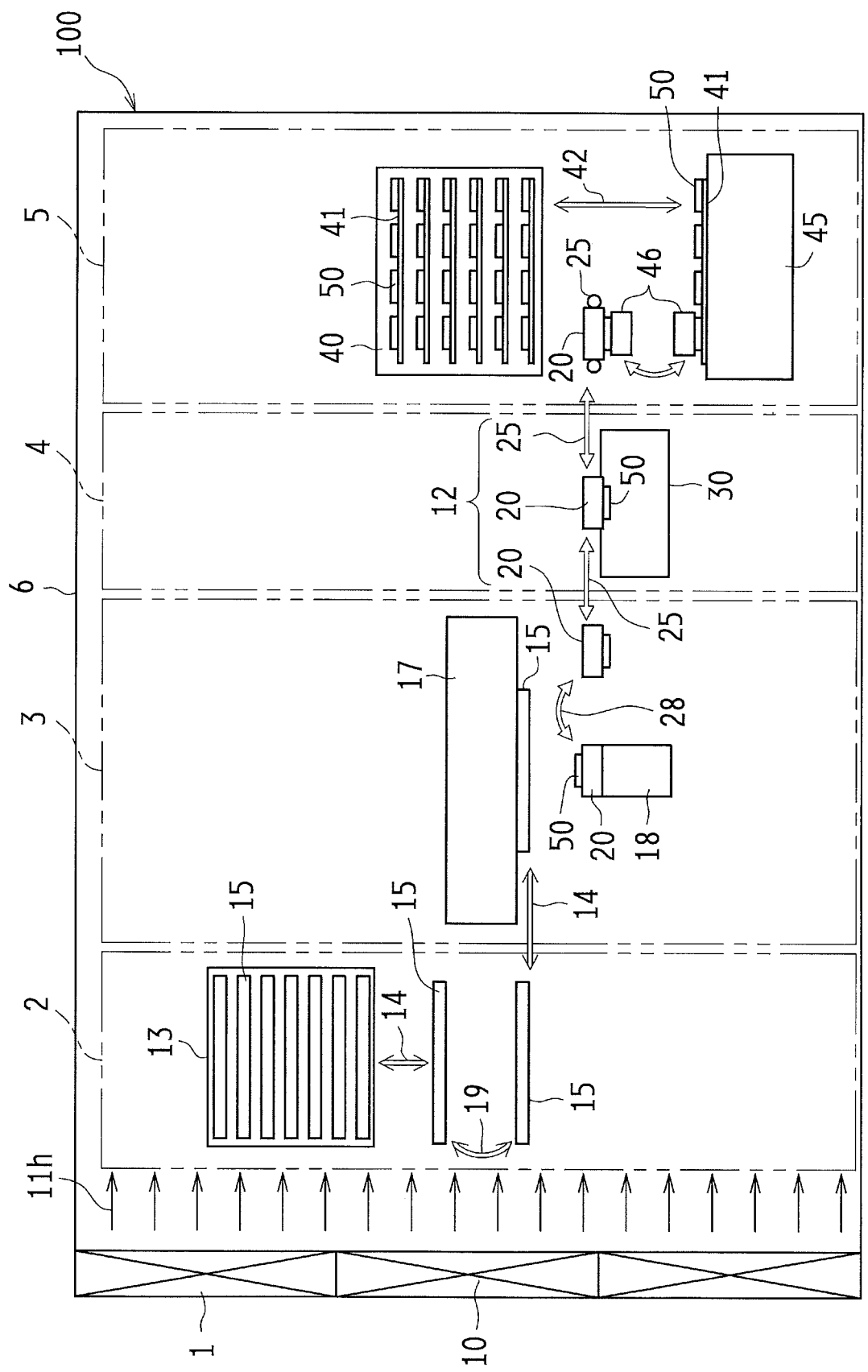
FIG. 11 is a front view illustrating bonding equipment according to a fifth embodiment of the present disclosure.

FIG. 11 is a front view illustrating the bonding equipment according to the fifth embodiment of the present disclosure. In the bonding equipment 100 according to the fifth embodiment, the horizontal laminar flow 11$h$ is formed by the laminar flow source 1 in the same manner as in the second embodiment. In addition, the bonding equipment 100 has a characteristic in that the bonding equipment 100 has a hold surface on a lower surface of the bonding stage 17 and the bonding head 20 is pressed and bonded from a lower side of the bonding stage 17.

In addition to the substrate transfer tool 14 which transfers the substrate 15, the substrate handling portion 2 includes a substrate inverting portion 19 which rotates the transferred substrate 15 by 180 degrees. The substrate inverting portion 19 has a function of rotating the substrate 15 in the same perpendicular direction as the substrate rotation portion 16, although the rotation angle is different. The substrate 15 of which the electrode surface faces upward is set to the substrate cassette 13.

In the substrate handling portion 2, the substrate is taken out from the substrate cassette 13 by the substrate transfer tool 14, and the substrate inverting portion 19 performs an inverting operation of inverting the electrode surface upside down. After then, in a state in which the electrode surface faces downward, the substrate 15 is transferred from the substrate handling portion 2 to the bonding portion 3. In the bonding portion 3, the bonding stage 17 is disposed in the horizontal laminar flow 11$h$ in a state in which the hold surface of the bonding stage 17 faces downward.

For the bonding stage 17, the chip 50 is delivered from the pickup head 46 to the bonding head 20 in the chip handling portion 5. While being transferred from the cleaning portion 4 to the bonding portion 3, the chip 50 is inverted upside down while being integrated with the bonding head 20, by an inverting portion 28. The transfer hand 25 holds the bonding head 20 in a state in which the chip 50 faces upward, and the bonding head 20 is attached to the head driving portion 18 provided below the bonding stage 17. The head driving portion 18 is connected to the bonding head 20 from a lower side of the bonding head 20 and drives the bonding head 20.

According to the bonding equipment 100 of the present embodiment as well, it is possible to considerably reduce the amount of dust which is interposed on the bonding surface of the substrate 15 and the chip 50 and causes a bonding defect, and to improve a bonding yield between the substrate 15 and the chip 50. In particular, in the configuration according to the present embodiment, even if the dust is generated due to up-and-down movement of the head driving portion 18, it becomes possible to avoid the dust from falling onto the substrate 15 in the substrate handling portion 2 and the bonding portion 3. At the same time, it becomes also possible to remove the dust remaining on the substrate 15.

The present disclosure is not limited to the embodiments described above and various modifications are possible within the scope indicated in the claims, and an embodiment obtained by appropriately combining technical portions respectively disclosed in different embodiments is also included in the technical scope of the present disclosure. Further, by combining technical portions disclosed in each embodiment, new technical features can be formed.

In the description of each of the embodiments, the bonding between the chip such as a semiconductor chip and the substrate such as a wafer is described, but the present disclosure is not limited thereto and it is also possible to apply the embodiment to bonding of a chip and a chip. In addition, the chip in this case is not limited to a micro LED or the like.

Example

As an example, the bonding equipment 100 according to the present disclosure manufactured a blue micro LED display element (monochrome) having pixels with the number of 240×427 (approximately 100K pixels), a pixel size of 10 µm square and a display element having a display portion with a size of 2.4 mm×4.3 mm and a driving circuit LSI with a size of 4 mm×6 mm. The driving circuit LSI was formed on an 8-inch wafer, and the number of times being mounted was 1080.

As a comparative example, when manufacturing a display element by a general flip chip bonder in the related art for 918 driving circuit LSIs determined to be a good product in a test, the number of good products having all emitting pixels was 128, and a yield was exceptionally low at approximately 14%.

In the bonding equipment 100, the following two cleaning methods were executed.

(A) Alkaline Solution Cleaning Agent (Cleaning Used for Wafer Cleaning)

Cleaning, pure water cleaning, and nitrogen blow drying were performed by using an alkaline cleaning solution, as a cleaning agent, obtained by mixing ammonia ($NH_4OH$) and hydrogen peroxide ($H_2O_2$) while applying an ultrasonic wave through a cleaning agent nozzle.

(B) Dry Ice Blast Cleaning Agent

Dry ice snow, as a cleaning agent, formed by adiabatically expanding liquefied carbonic acid was placed on a nitrogen blow and a fine particle of dry ice collided with a chip surface at high speed. Since the dry ice is vaporized, drying residual did not occur and it was not desired for a drying step as in a case of using an aqueous solution or a solvent, so that a processing time was short.

Yields in cases of respectively executing cleaning by the cleaning method (A) and the cleaning method (B) were 61% and 67%, and both of the cleaning methods were able to improve the yield from 4 times to 4.8 times. In this manner, by using the bonding equipment 100, it is possible to considerably improve the yield of obtaining the display element without a defect. When a pixel size is reduced and color display is further performed, the electrode size becomes small and the number of electrodes also increases, so that it is considered that the present effect further expands.

Therefore, according to the bonding equipment 100 of the present disclosure, it is possible to considerably reduce the amount of dust which is interposed on the bonding surface of the substrate and the chip and causes a bonding defect, and to improve a bonding yield between the substrate and the chip.

The present disclosure contains subject matter related to that disclosed in Japanese Priority Patent Application JP 2018-040056 filed in the Japan Patent Office on Mar. 6, 2018, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. Bonding equipment for bonding a chip having a first electrode and a substrate having a second electrode so that the first electrode and the second electrode are electrically connected to each other, the bonding equipment comprising:
   a laminar flow source adapted to generate a laminar flow in which dust is removed;
   a chip handling portion adapted to pick the chip up;
   a cleaning portion adapted to clean the chip;
   a bonding portion which includes a bonding stage adapted to bond the chip and the substrate; and
   a transfer mechanism adapted to transfer the chip from the chip handling portion to the bonding portion, wherein
   at least the cleaning portion and the bonding portion are provided in the laminar flow, and
   the cleaning portion includes a cleaning cup and a door closing an upper portion of the cleaning cup.

2. The bonding equipment according to claim 1, wherein the transfer mechanism includes at least one bonding head adapted to chuck the chip, the bonding portion further includes a head driving portion to which the bonding head is attached when the bonding is done, and the cleaning portion is provided in a transfer section from the chip handling portion to the bonding portion and the chip is cleaned while being chucked by the bonding head.

3. The bonding equipment according to claim 2, wherein the transfer mechanism includes a plurality of bonding heads for one head driving portion.

4. Bonding equipment for bonding a chip having a first electrode and a substrate having a second electrode so that the first electrode and the second electrode are electrically connected to each other, the bonding equipment comprising:
   a laminar flow source adapted to generate a laminar flow in which dust is removed;
   a chip handling portion adapted to pick the chip up;
   a cleaning portion adapted to clean the chip;
   a bonding portion which includes a bonding stage adapted to bond the chip and the substrate; and
   a transfer mechanism adapted to transfer the chip from the chip handling portion to the bonding portion, wherein
   at least the cleaning portion and the bonding portion are provided in the laminar flow,
   the transfer mechanism includes at least one bonding head adapted to chuck the chip,
   the cleaning portion is provided in a transfer section from the chip handling portion to the bonding portion and the chip is cleaned while being chucked by the bonding head,
   the cleaning portion includes a cleaning cup and a door closing an upper portion of the cleaning cup, and the door holds the bonding head in place.

5. The bonding equipment according to claim 2, wherein the bonding head includes a utility connection portion on a surface on a side opposite to a surface adapted to chuck the chip.

6. Bonding equipment for bonding a chip having a first electrode and a substrate having a second electrode so that the first electrode and the second electrode are electrically connected to each other, the bonding equipment comprising:
   a laminar flow source adapted to generate a laminar flow in which dust is removed;
   a chip handling portion adapted to pick the chip up;
   a cleaning portion adapted to clean the chip;
   a bonding portion which includes a bonding stage bonding the chip and the substrate; and
   a transfer mechanism transferring the chip from the chip handling portion to the bonding portion, wherein
   at least the cleaning portion and the bonding portion are provided in the laminar flow,
   the transfer mechanism includes at least one bonding head adapted to chuck the chip,
   the cleaning portion is provided in a transfer section from the chip handling portion to the bonding portion and the chip is cleaned while being chucked by the bonding head, and
   the transfer mechanism includes a first transfer hand adapted to hold the bonding head in place and transferring the bonding head.

7. The bonding equipment according to claim 1, wherein the transfer mechanism includes a second transfer hand for holding and transferring the chip, and the second transfer hand dechucks the transferred chip from each of the chip handling portion, the cleaning portion, and the bonding portion.

8. The bonding equipment according to claim 6, wherein the cleaning portion includes a cleaning cup, a door for closing an upper portion of the cleaning cup, and a cleaning stage for holding the chip.

9. The bonding equipment according to claim 7, wherein the second transfer hand inverts the chip by rotating the chip by 180 degrees between the cleaning portion and the bonding portion.

10. The bonding equipment according to claim 7, wherein a tip portion of the second transfer hand includes a chucking part adapted to chuck a surface, not having the first electrode, of the chip and the chucking part is smaller than a size of the chip.

11. Bonding equipment for bonding a chip having a first electrode and a substrate having a second electrode so that the first electrode and the second electrode are electrically connected to each other, the bonding equipment comprising:
    a laminar flow source adapted to generate a laminar flow in which dust is removed;
    a chip handling portion adapted to pick the chip up;
    a cleaning portion adapted to clean the chip;
    a bonding portion which includes a bonding stage adapted to bond the chip and the substrate; and
    a transfer mechanism adapted to transfer the chip from the chip handling portion to the bonding portion, wherein
    at least the cleaning portion and the bonding portion are provided in the laminar flow, and
    a hold surface adapted to chuck the substrate is provided on the bonding stage and the laminar flow source generates a laminar flow parallel to the hold surface.

12. The bonding equipment according to claim 11, wherein the substrate is transferred along a horizontal plane and the laminar flow is a horizontal laminar flow.

13. The bonding equipment according to claim 11, wherein the substrate is transferred in a perpendicular direction from a horizontal plane and the laminar flow is a laminar flow perpendicular to the horizontal plane.

14. The bonding equipment according to claim 13, wherein the cleaning portion includes a cleaning cup and a door adapted to close an upper portion of the cleaning cup, and the door rotates from a horizontal direction to the perpendicular direction and holds the bonding head in place.

15. The bonding equipment according to claim 11, wherein the bonding stage is provided with the hold surface facing downward and the bonding head includes an inverting portion for inverting the held chip.

16. The bonding equipment according to claim 1,
wherein a substrate handling portion, which receives the substrate, supplies the substrate to the bonding portion, and draws the substrate out, is provided in the laminar flow.

17. Bonding equipment for bonding a chip having a first electrode and a substrate having a second electrode so that the first electrode and the second electrode are electrically connected to each other, the bonding equipment comprising:
- a laminar flow source adapted to generate a laminar flow in which dust is removed;
- a chip handling portion adapted to pick the chip up;
- a cleaning portion adapted to clean the chip;
- a bonding portion which includes a bonding stage adapted to bond the chip and the substrate; and
- a transfer mechanism adapted to transfer the chip from the chip handling portion to the bonding portion, wherein at least the cleaning portion and the bonding portion are provided in the laminar flow,
- a substrate handling portion, which receives the substrate, supplies the substrate to the bonding portion, and draws the substrate out, is provided in the laminar flow, and
- the substrate handling portion has a method of providing a connection material, for electrically connecting the first electrode and the second electrode, on the substrate.

18. The bonding equipment according to claim 16,
wherein the substrate handling portion rotates the substrate in a perpendicular direction.

19. The bonding equipment according to claim 1,
wherein the cleaning portion includes a nozzle which emits a cleaning agent for cleaning the chip.

20. The bonding equipment according to claim 19,
wherein the cleaning agent includes dry ice.

* * * * *